(12) United States Patent
Toschkoff et al.

(10) Patent No.: US 11,271,134 B2
(45) Date of Patent: Mar. 8, 2022

(54) METHOD FOR MANUFACTURING AN OPTICAL SENSOR AND OPTICAL SENSOR

(71) Applicant: ams AG, Premstaetten (AT)

(72) Inventors: Gregor Toschkoff, Premstaetten (AT); Thomas Bodner, Premstaetten (AT); Franz Schrank, Premstaetten (AT); Miklos Labodi, Premstaetten (AT); Joerg Siegert, Premstaetten (AT); Martin Schrems, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/756,025

(22) PCT Filed: Oct. 15, 2018

(86) PCT No.: PCT/EP2018/078064
§ 371 (c)(1),
(2) Date: Apr. 14, 2020

(87) PCT Pub. No.: WO2019/076806
PCT Pub. Date: Apr. 25, 2019

(65) Prior Publication Data
US 2020/0313031 A1 Oct. 1, 2020

(30) Foreign Application Priority Data
Oct. 16, 2017 (EP) .................................. 17196609

(51) Int. Cl.
*H01L 31/18* (2006.01)
*H01L 27/146* (2006.01)
(Continued)

(52) U.S. Cl.
CPC ........ *H01L 31/1876* (2013.01); *G01J 1/0219* (2013.01); *G01J 1/0407* (2013.01);
(Continued)

(58) Field of Classification Search
None
See application file for complete search history.

(56) References Cited

U.S. PATENT DOCUMENTS 9,543,347 B2 * 1/2017 Oganesian .......... H01L 25/0655
2001/0016400 A1 8/2001 Lee
(Continued)

FOREIGN PATENT DOCUMENTS

EP 3196939 A1 7/2017
EP 3282480 A1 2/2018
(Continued)

OTHER PUBLICATIONS

Tang, T. et al.: "Challenges of Ultrathin 5 sides Molded WLCSP" (figure 4), ECTC, 2016 conference proceedings, pp. 1167-1171.
(Continued)

*Primary Examiner* — Andres Munoz
(74) *Attorney, Agent, or Firm* — MH2 Technology Law Group LLP

(57) ABSTRACT

A method for manufacturing an optical sensor is provided. The method comprises providing an optical sensor arrangement which comprises at least two optical sensor elements on a carrier, where the optical sensor arrangement comprises a light entrance surface at the side of the optical sensor elements facing away from the carrier. The method further comprises forming a trench between two optical sensor elements in a vertical direction which is perpendicular to the main plane of extension of the carrier, where the trench extends from the light entrance surface of the sensor arrangement at least to the carrier. Moreover, the method comprises coating the trench with an opaque material, forming electrical contacts for the at least two optical sensor elements on a back side of the carrier facing away from the optical sensor elements, and forming at least one optical sensor by dicing the optical sensor arrangement along the (Continued)

trench. Each optical sensor comprises an optical sensor element, and the light entrance surface is free of electrical contacts and at least partially free of the opaque material above the optical sensor elements. Furthermore, an optical sensor is provided.

10 Claims, 11 Drawing Sheets

(51) Int. Cl.
    *G01J 1/02*     (2006.01)
    *G01J 1/04*     (2006.01)
    *H01L 31/02*     (2006.01)
    *H01L 31/0203*     (2014.01)
    *H01L 31/0216*     (2014.01)

(52) U.S. Cl.
    CPC .. *H01L 27/14618* (2013.01); *H01L 27/14623* (2013.01); *H01L 27/14698* (2013.01); *H01L 31/0203* (2013.01); *H01L 31/02005* (2013.01); *H01L 31/02161* (2013.01)

(56) References Cited

U.S. PATENT DOCUMENTS

| | | |
|---|---|---|
| 2010/0032781 A1 | 2/2010 | Ryu |
| 2010/0052192 A1* | 3/2010 | Hasegawa ......... H01L 27/14685 |
| | | 257/797 |
| 2010/0117176 A1* | 5/2010 | Uekawa ............ H01L 31/02164 |
| | | 257/432 |
| 2010/0164032 A1 | 7/2010 | Kita |
| 2017/0125467 A1 | 5/2017 | Lin et al. |
| 2017/0146645 A1 | 5/2017 | Kim et al. |
| 2017/0301713 A1* | 10/2017 | Sekine ..................... H01L 27/14 |
| 2019/0051762 A1* | 2/2019 | Yu .......................... H01L 33/486 |

FOREIGN PATENT DOCUMENTS

| | | |
|---|---|---|
| WO | 2014/084972 A1 | 6/2014 |
| WO | 2017/146645 A1 | 8/2017 |

OTHER PUBLICATIONS

European Patent Office, International Search Report for PCT/EP2018/078064, dated Nov. 22, 2018.

* cited by examiner

METHOD FOR MANUFACTURING AN OPTICAL SENSOR AND OPTICAL SENSOR

CROSS-REFERENCE TO RELATED APPLICATIONS

The present application is the national stage entry of International Patent Application No. PCT/EP2018/078064, filed on Oct. 15, 2018, which claims the benefit of priority of European Patent Application No. 17196609.6, filed on Oct. 16, 2017, all of which are hereby incorporated by reference in their entirety for all purposes.

BACKGROUND OF THE INVENTION

The present disclosure relates to a method for manufacturing an optical sensor and to an optical sensor.

Optical sensors are widely employed in many different fields such as digital still cameras, cellular phones, security cameras, medical equipment, lighting applications, wearable devices, screen management, automobiles and other applications. For many optical sensors it is required that light can enter the optical sensor only from one side of the sensor. For example, it is desired to mount an optical sensor close to or integrated into the display of a mobile device and to detect only light coming from outside of the mobile device and no light from a display illumination or other internal sources. Therefore, an opaque coating is required for the optical sensor. One possible solution is to coat an optical sensor with thick coating layers as side walls on a single die level. However, in this case, the production process is complicated and the size and the weight of the optical sensor device is increased.

It is also possible to coat optical sensors already on wafer-level. Wafer-level packages can be cheaper and smaller than single die packages. However, wafer-level processes can be inefficient and complicated. For example, some wafer-level processes require back grinding of the wafer which is not feasible in every case. Furthermore, in some cases it is required to block light entering the optical sensor from a bottom side.

SUMMARY OF THE INVENTION

This disclosure provides a method for manufacturing an optical sensor which enables a cheap and efficient production of the optical sensor. This disclosure further provides an optical sensor which can be produced in a cheap and efficient way.

According to at least one embodiment of the method for manufacturing an optical sensor, the method comprises the step of providing an optical sensor arrangement which comprises at least two optical sensor elements on a carrier, where the optical sensor arrangement comprises a light entrance surface at the side of the optical sensor elements facing away from the carrier. The optical sensor elements can be, for example, charge coupled devices, complementary metal oxide semiconductor devices, photo diodes, ultraviolet sensors or pyro-electrical sensors. The term "optical" refers to the range of visible, ultraviolet and infrared light. It is also possible that one optical sensor arrangement comprises a plurality of optical sensor elements.

The optical sensor elements can be grown or manufactured on the carrier and they are arranged next to each other on the carrier. For example, one or more semiconductor layers can be grown on the carrier and the optical sensor elements can be grown on or within the semiconductor layer. The semiconductor layer can comprise a complementary metal oxide semiconductor (CMOS) structure. Preferably, the dopant concentration of the semiconductor layer is very high. It is also possible that dopant concentration of the semiconductor layer is medium or low. The semiconductor layer can for example comprise silicon.

Each optical sensor element can comprise at least one electrical contact such that the optical sensors can be contacted and that they are electrically isolated from each other. The carrier can be a wafer and it can comprise, for example, silicon with a high dopant concentration.

The light entrance surface can be parallel to the main plane of extension of the carrier. The light entrance surface can extend over the total lateral extension of the carrier. The lateral direction is parallel to the main plane of extension of the carrier. It is further possible that a lateral extent of the light entrance surface is smaller than a lateral extent of an optical sensor element. Light entering the optical sensor arrangement through the light entrance surface can be detected by the optical sensor elements. The light entrance surface can be the topmost surface of the optical sensor arrangement. Between the light entrance surface and the optical sensor elements different materials or layers can be arranged which can be transparent for light from a specified wavelength range. It is further possible that the light entrance surface or layers between the light entrance surface and the optical sensor elements are opaque in places, such that only a part of the light entering the optical sensor arrangement is reaching the optical sensor elements, for example to form an aperture.

The method for manufacturing an optical sensor further comprises the step of forming a trench between two optical sensor elements in a vertical direction which is perpendicular to the main plane of extension of the carrier, where the trench extends from the light entrance surface of the optical sensor arrangement at least to the carrier. The trench can be formed by dicing, which can be for example a mechanical dicing step, plasma dicing or laser dicing. It is also possible that the trench is formed by a sawing process. The trench can be formed by dicing the optical sensor arrangement from the side of the light entrance surface at least towards the carrier. This means all layers and materials between the light entrance surface and the carrier are diced or cut in order to form the trench. That the trench extends at least to the carrier means, that the carrier is not necessarily diced to form the trench. This means, at least all layers and materials between the light entrance surface and the carrier are diced to form the trench. However, it is also possible that the trench extends through the carrier or a part of the carrier. In this case the carrier or a part of the carrier is diced or cut to form the trench.

After the dicing, the trench comprises a thickness which is given by the diameter or the lateral extent of the trench. Preferably, the thickness of the trench is approximately constant along the trench. The trench comprises inner walls which are approximately perpendicular to the main plane of extension of the carrier. If several optical sensor elements are arranged next to each other on the carrier, trenches can be formed between all optical sensor elements.

The method for manufacturing an optical sensor further comprises the step of coating the trench with an opaque material. This means, the trench is filled with the opaque material. The trench can for example be filled with the opaque material by wafer-level molding, transfer molding or other molding techniques. It is possible that the trench is completely filled with the opaque material. It is further possible that only the inner walls and a bottom surface of the trench are covered with the opaque material.

The opaque material is opaque for light and electromagnetic radiation which his to be detected by the optical sensor. This means, the opaque material absorbs light hitting the opaque material. For example, the absorption coefficient of the opaque material can be high, which means close to 100%, for a desired wavelength range. Furthermore, the opaque material can comprise a very low transmission for light in the visible range or in the infrared range. The opaque material can for example comprise an oxide, silicone or carbon particles.

The method for manufacturing an optical sensor further comprises the step of forming electrical contacts for the at least two optical sensor elements on a back side of the carrier facing away from the optical sensor elements. This means, each optical sensor element is electrically connected with at least one electrical contact on the back side of the carrier. Preferably, each optical sensor element is electrically connected with two electrical contacts. The electrical connection between the optical sensor elements and the electrical contacts can for example be formed by through silicon vias that extend through the carrier from the optical sensor elements to the electrical contacts. The electrical contacts can for example comprise solder bumps.

By forming the electrical contacts at the back side of the carrier the optical sensors that are manufactured by the method are surface-mountable. Furthermore, it is possible to apply mold layers or different materials that cover the side of the optical sensor elements facing away from the carrier completely or at least in places.

It is also possible that the opaque material is applied at the back side of the carrier. If the carrier is not opaque it can be coated with the opaque material also from the back side in order to prevent unwanted light from reaching the optical sensor elements.

The method for manufacturing an optical sensor further comprises the step of forming at least one optical sensor by dicing the optical sensor arrangement along the trench, where each optical sensor comprises an optical sensor element, and the light entrance surface is free of electrical contacts and at least partially free of the opaque material above the optical sensor elements. The optical sensor arrangement can be diced from the back side of the carrier towards the light entrance surface. It is also possible that the optical sensor is formed by a sawing process. If the trench does not extend through the carrier, the carrier is diced along a vertical line which extends through the trench. If the trench only extends through a part of the carrier, the carrier is diced along the trench and along a vertical line which extends through the trench. This means, the optical sensor is formed by singulating the optical sensor arrangement along the trench. In this way, a dicing trench is formed between the optical sensors. After singulating, the optical sensors can for example be arranged on a handling substrate.

The optical sensor arrangement is diced along the trench in such a way that at least a part of the opaque material remains at the inner walls of the trench. This means, the width of the dicing trench in a lateral direction is smaller than the width of the trench filled with the opaque material in the lateral direction. The lateral direction is parallel to the main plane of extension of the carrier. In this way, each optical sensor comprises an opaque coating formed by the opaque material at side surfaces of the optical sensor. The opaque material prevents unwanted light from reaching the optical sensor elements.

The opaque coating for each optical sensor covers the side surfaces of the optical sensors at least in places where the side surfaces are perpendicular to the main plane of extension of the carrier. If the trench does not extend through the carrier, the opaque coating does not cover the whole side surfaces but only parts of the side surfaces. As the opaque coating reaches up to the light entrance surface, the light entrance surface can be free of the opaque material above the optical sensor elements. This means, the light entrance surface can be free of the opaque material in vertical direction above the optical sensor elements. In the region of the opaque coating, the light entrance surface is not free of the opaque material. The opaque coating can laterally surround the light entrance surface in the main plane of extension of the light entrance surface.

That the light entrance surface is at least partially free of the opaque material above the optical sensor elements means, that the opaque material can cover the light entrance surface at least in places. For example, the opaque material can form an aperture above the optical sensor elements. Therefore, the light entrance surface is at least in places free of the opaque material.

As the electrical contacts of the optical sensor elements are arranged at the back side of the carrier, the light entrance surface is free of electrical contacts. Therefore, the light path of light entering the optical sensor is free of any unwanted material as for example electrical contacts or the opaque material.

Since the optical sensor elements are provided on the carrier, which can be a wafer, a plurality of optical sensors can be manufactured at the same time. Preferably, a plurality of optical sensor elements is provided on the carrier. Since several thousands of optical sensors can be processed simultaneously on wafer-level, the optical sensors can be manufactured very efficiently and at reduced cost. Furthermore, it is more efficient to combine the coating of the optical sensors and the singulation of the optical sensor arrangement by forming the trenches between the optical sensor elements.

The optical sensor is manufactured on wafer-level which reduces the cost compared to solutions where single die handling is needed.

According to at least one embodiment of the method for manufacturing an optical sensor, a handling substrate is arranged at the back side of the carrier during forming the trench and during coating the trench with the opaque material. Between the handling substrate and the carrier a glue layer can be arranged. The glue layer can be a temporary bonding which can be removed after coating the trench with the opaque material. It is also possible that the carrier is arranged on a tape which is connected to a handling frame. Also the tape and the handling frame can be removed after coating the trench with the opaque material.

When the optical sensor arrangement is singulated it can be arranged on the handling substrate as well. If several optical sensors are arranged next to each other on the handling substrate, the handling substrate can be employed to handle and move the optical sensors. Furthermore, the handling substrate improves the stability of the optical sensor arrangement during formation of the trench, during coating the trench with the opaque material and during singulation. In addition, by employing the handling substrate the handling of the optical sensor arrangement is improved before, during and after processing.

It is possible to employ different handling substrates for different processing steps. For example, different handling substrates can be chosen according to the temperature or hardness requirements of the processing.

According to at least one embodiment of the method for manufacturing an optical sensor, the handling substrate is a tape that is expanded in a lateral direction during the manufacturing, where the lateral direction is parallel to the main plane of extension of the carrier. Expanding the handling substrate means that the lateral extent of the handling substrate is increased during expanding. Therefore, the handling substrate can comprise a tape which is fixed to a handling frame. The optical sensor arrangement is arranged on the tape. The tape can be for example a polymer foil which can be expanded or stretched in lateral direction.

The handling substrate can be expanded after the formation of the trench. After the formation of the trench, the trench has a thickness in lateral direction. When the handling substrate is expanded, the thickness of the trench in lateral direction is increased. If the optical sensor arrangement comprises a plurality of trenches, the thickness of most of or of all trenches is increased by expanding the handling substrate.

By increasing the thickness of the trench also the thickness of the opaque material to be filled in the trench is increased. In this way, the thickness of the opaque coating arranged at the side surfaces of the optical sensor can be tuned or chosen. By tuning the thickness of the trench and the opaque material within the trench, also the thickness of the opaque coating which remains at the side surfaces of the optical sensor after singulation of the optical sensor can be tuned. A tuning of the thickness of the opaque coating can be desired for tuning the absorption coefficient of the opaque coating. For example, by increasing the thickness of the opaque coating the absorption coefficient can be increased.

Advantageously, by expanding the handling substrate for increasing the thickness of the trench, the same amount of material of the carrier and the semiconductor layer are required as without expanding the handling substrate. If the thickness of the trench was increased on a handling substrate which is not expanded, more material of the carrier and the semiconductor layer would be removed during formation of the trench. Therefore, employing a handling substrate which can be expanded saves material of the carrier and the semiconductor layer. Furthermore, by employing a handling substrate which can be expanded, the thickness of a plurality of trenches can be increased in a simple way without moving single parts of the optical sensor arrangement for increasing the thickness of the trenches.

According to at least one embodiment of the method for manufacturing an optical sensor, the trench is coated by a molding process. The trench can be for example filled with a mold material in a transfer molding step, by wafer-level molding or by other molding techniques. It is also possible that only the inner walls of the trench are coated with the opaque material forming an opaque coating.

According to at least one embodiment of the method for manufacturing an optical sensor, the trench is completely filled with the opaque material. This means, the complete volume of the trench is filled with the opaque material. Furthermore, the inner walls are completely covered with the opaque material.

According to at least one embodiment of the method for manufacturing an optical sensor, the optical sensor is formed by dicing after the trench is coated with the opaque material. This means, at first the trench is formed and then it is coated with the opaque material. After coating the trench with the opaque material the optical sensor arrangement is diced along the trench. If the trench does not extend through the carrier, the optical sensor arrangement is further diced along a vertical line which extends through the trench. This means, the optical sensor arrangement is completely diced from the back side of the carrier towards the light entrance surface. In this way, an optical sensor comprising at least one optical sensor element is formed.

If the optical sensor is formed after the trench is coated with the opaque material, the opaque coating at the side surfaces of the optical sensor shows signs of the dicing process. This means, the surface of the opaque coating can for example be rough or structured because of the dicing process.

According to at least one embodiment of the method for manufacturing an optical sensor, at least one electrically conductive via is formed in the carrier. The electrically conductive via can be for example a through silicon via. The electrically conductive via can extend through the carrier for example from the back side of the carrier towards an optical sensor element. The electrically conductive via can electrically connect an optical sensor element with an electrical contact at the back side of the carrier.

According to at least one embodiment of the method for manufacturing an optical sensor, after forming the optical sensor by dicing, the thickness of the opaque material in lateral direction amounts to less than 20% of the thickness of the optical sensor in a lateral direction which is parallel to the main plane of extension of the carrier. The opaque material at the side surfaces of the optical sensor forms an opaque coating with a thickness in lateral direction. Therefore, also the thickness of the opaque coating lateral direction amounts to less than 20% of the thickness of one optical sensor in a lateral direction. Preferably, the thickness of the opaque material in the lateral direction amounts to less than 10% of the thickness of the optical sensor in the lateral direction.

By employing the method described here a very thin opaque coating is formed at the side surfaces of the optical sensor. Advantageously, with a very thin opaque coating the total footprint of the optical sensor is not significantly increased by adding the opaque coating.

According to at least one embodiment of the method for manufacturing an optical sensor, the carrier comprises an opaque material. This means the carrier has a high absorption coefficient. Therefore, most of the light or electromagnetic radiation hitting the carrier is absorbed by the carrier. Advantageously, for a carrier which comprises an opaque material no opaque coating is required at the back side of the carrier in order to prevent unwanted light from reaching the optical sensor element. Furthermore, the trench does not necessarily have to extend through the carrier. As the carrier comprises an opaque material no opaque coating is required in the region of the carrier. This means, it is possible that the optical sensor comprises an opaque coating which covers the side surfaces of the optical sensor in all regions except for the side surfaces of the carrier. In this way, less opaque material is required to form the opaque coating of the optical sensor.

According to at least one embodiment of the method for manufacturing an optical sensor, at least one cover element is arranged at the side of the optical sensor elements which faces away from the carrier. The cover element can extend over the whole lateral extent of the carrier. The cover element can comprise one or more structured or unstructured layers that are applied to semiconductor layer with the optical sensor elements. It is also possible that the cover element comprises several structures. The cover element is applied to the optical sensor arrangement before the trench is formed. The layers or structures of the cover element can for example comprise optical elements, create apertures, define opening angles or create defined distances. The cover element can for example comprise transparent material as spacers, a diffuser or diffuser layers. The cover element can for example be formed by wafer-level molding. In this case the cover element can comprise silicon or an epoxy material.

According to at least one embodiment of the method for manufacturing an optical sensor, the extension of the trench in vertical direction is smaller than the total extension of the optical sensor arrangement in vertical direction. This means, the trench does not extend through the whole carrier. It is possible that the trench extends only through a part of the carrier in vertical direction. It is also possible that the trench does not extend through the carrier. Preferably, in this case the carrier comprises an opaque material.

If the trench does not extend through the carrier or only through a part of the carrier, the opaque coating of the optical sensor does not cover the whole side surfaces of the optical sensor. In this way, less opaque material is required to form the opaque coating of the optical sensor. As the carrier in most cases has a greater thickness in vertical direction than the other parts of the optical sensor arrangement a significant amount of opaque material can be saved. Furthermore, if the trench does not extend through the carrier or only through a part of the carrier, the carrier stabilizes the optical sensor arrangement after forming the trench.

Since the side surfaces of the optical sensor are not completely covered with the opaque coating the side surfaces show different signs of the dicing process. For example, the opaque coating and the parts of the carrier which are not coated with the opaque coating show different signs of the dicing process.

According to at least one embodiment of the method for manufacturing an optical sensor, the trench extends through the whole carrier in vertical direction. This means, the trench extends from the light entrance surface towards the back side of the carrier. During formation of the trench and during dicing the optical sensor arrangement is arranged on a handling substrate. In this case, it is possible that the carrier does not comprise an opaque material. This means, the material of the carrier can be chosen irrespective of the absorption properties.

Furthermore, an optical sensor is provided. The optical sensor can optionally be produced by means of one of the methods described herein. This means all features disclosed for the method for manufacturing an optical sensor are also disclosed for the optical sensor and vice-versa.

In one embodiment of the optical sensor, the optical sensor comprises an optical sensor element on a carrier. The optical sensor element can be, for example, a charge coupled device, a complementary metal oxide semiconductor device, a photo diode, an ultra-violet sensor or a pyro-electrical sensor. The optical sensor element can be grown or manufactured on the carrier. For example, one or more semiconductor layers can be grown on the carrier and the optical sensor element can be grown on or within the semiconductor layer. The semiconductor layer can for example comprise silicon. The optical sensor element can comprise at least one electrical contact such that the optical sensor element can be contacted. The carrier can be a wafer and it can comprise, for example, silicon with a high dopant concentration.

The optical sensor further comprises a cover element arranged at the side of the optical sensor element facing away from the carrier. The cover element can comprise one or more structured or unstructured layers that are applied to the semiconductor layer with the optical sensor element. It is also possible that the cover element comprises several structures. The layers or structures of the cover element can for example comprise optical elements, create apertures, define opening angles or create defined distances. The cover element can for example comprise a transparent material as spacers, a diffuser or diffuser layers. The cover element can for example be formed by wafer-level molding. In this case the cover element can comprise silicon or an epoxy material.

The optical sensor further comprises a light entrance surface at the side of the cover element facing away from the optical sensor element. The light entrance surface can be parallel to the main plane of extension of the carrier. The light entrance surface can extend over the total lateral extension of the cover element. Light entering the optical sensor through the light entrance surface can be detected by the optical sensor element. The light entrance surface can be the topmost surface of the optical sensor.

The optical sensor further comprises at least one electrical contact at a back side of the carrier facing away from the optical sensor element. The optical sensor element is electrically connected with the at least one electrical contact on the back side of the carrier. The electrical connection between the optical sensor element and the electrical contact can for example be formed by a through silicon via that extends through the carrier from the optical sensor element to the electrical contact. The electrical contact can for example comprise solder bumps. By forming the electrical contact at the back side of the carrier the optical sensor is surface-mountable.

The optical sensor further comprises an opaque material forming a coating at the side surfaces of the optical sensor which are perpendicular to the light entrance surface, wherein the coating shows signs of a dicing process at least in places. The opaque material is opaque for light and electromagnetic radiation which his to be detected by the optical sensor. This means, the opaque material absorbs light hitting the opaque material and prevents unwanted light from reaching the optical sensor element. Furthermore, the opaque material can comprise a very low transmission for light in the visible range or in the infrared range. The opaque material can for example comprise an oxide or silicone.

The opaque coating covers the side surfaces of the optical sensor at least in places where the side surfaces are perpendicular to the main plane of extension of the carrier. It is possible that the opaque coating covers the side surfaces of the optical sensor in all places except for the carrier. If the carrier comprises an opaque material it is not necessary that the carrier is covered with the opaque coating. That the opaque coating shows signs of a dicing process means that the surface of the opaque coating can for example be rough or structured because of the dicing process.

As the opaque coating reaches up to the light entrance surface, the light entrance surface can be free of the opaque material above the optical sensor element. This means, the light entrance surface can be free of the opaque material in vertical direction above the optical sensor element. In the region of the opaque coating, the light entrance surface is not free of the opaque material. The opaque coating can laterally surround the light entrance surface in the main plane of extension of the light entrance surface.

It is further possible that the light entrance surface is at least partially free of the opaque material above the optical sensor element, which means that the opaque material can cover the light entrance surface at least in places. For example, the opaque material can form an aperture above the optical sensor element. Therefore, the light entrance surface is at least in places free of the opaque material.

The opaque coating at the side surfaces of the optical sensor can be very thin. Advantageously, with a very thin opaque coating the total footprint of the optical sensor is not significantly increased by adding the opaque coating.

In one embodiment of the optical sensor the coating has a settable thickness. This means, during manufacturing of the optical sensor the thickness of the opaque coating can be set or chosen. Setting the thickness of the opaque coating can be desired for tuning the absorption of the opaque coating. For example, by increasing the thickness of the opaque coating the absorption can be increased.

A settable thickness of the coating can for example be achieved by employing a handling substrate during manufacturing of the optical sensor where the handling substrate can be expanded as described above in one embodiment of the method for manufacturing an optical sensor.

In one embodiment of the optical sensor the thickness of the coating in a lateral direction amounts to less than 20% of the thickness of the optical sensor in the lateral direction which is parallel to the main plane of extension of the carrier. Preferably, the thickness of the coating in the lateral direction amounts to less than 10% of the thickness of the optical sensor in the lateral direction. Therefore, the footprint of the optical sensor is not significantly increased by adding the opaque coating.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

With FIGS. 1A to 1F, an exemplary embodiment of the method for manufacturing an optical sensor is described.

With FIGS. 3A to 3F, a further exemplary embodiment of the method for manufacturing an optical sensor is described.

Figure 4:
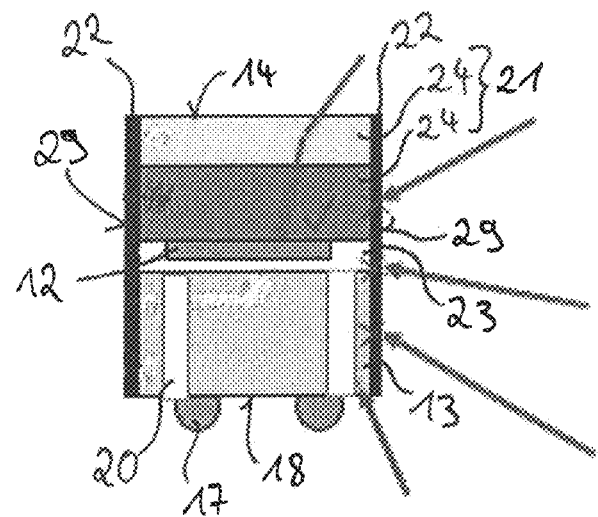

In FIG. 4, a cut-away view of a further exemplary embodiment of an optical sensor is shown.

With FIGS. 5A to 5H, a further exemplary embodiment of the method for manufacturing an optical sensor is described.

Figure 6:
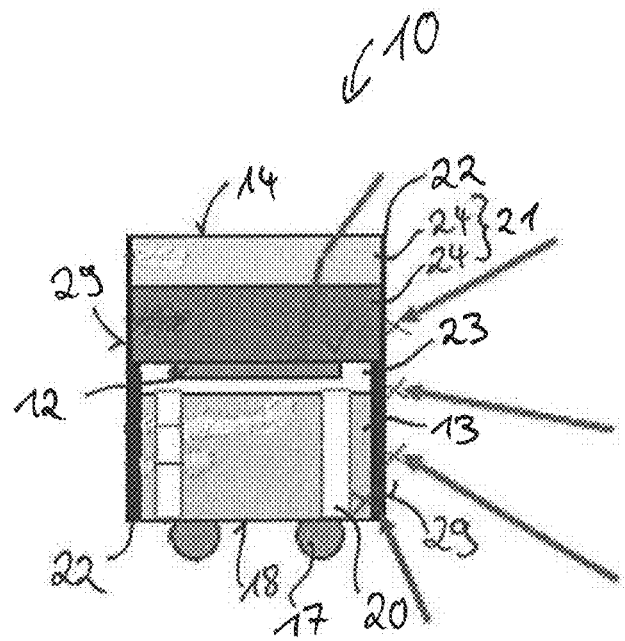

In FIG. 6, a cut-away view of a further exemplary embodiment of an optical sensor is shown.

Figure 7:
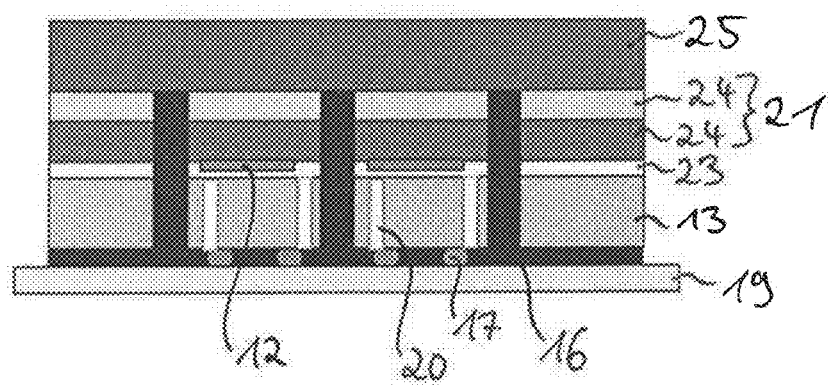

With FIG. 7 a manufacturing step for manufacturing an optical sensor is described.

Figure 8:
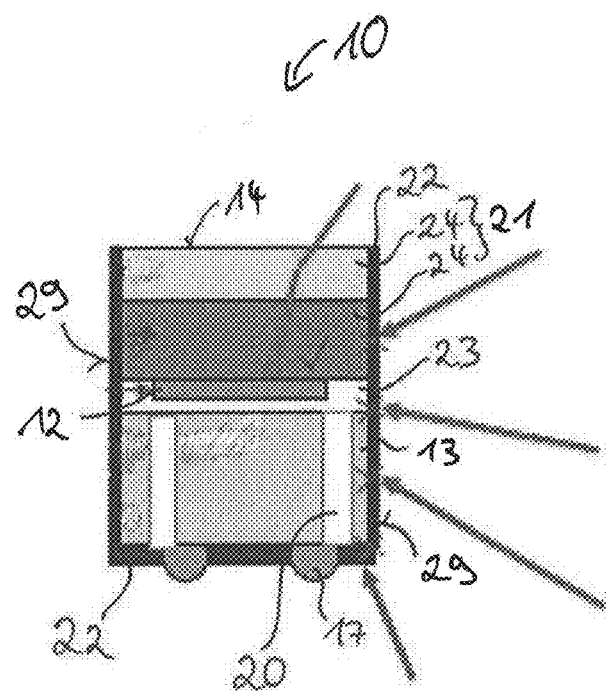

In FIG. 8, a cut-away view of a further exemplary embodiment of an optical sensor is shown.

With FIGS. 9A to 9I, a further exemplary embodiment of the method for manufacturing an optical sensor is described.

Figure 10:
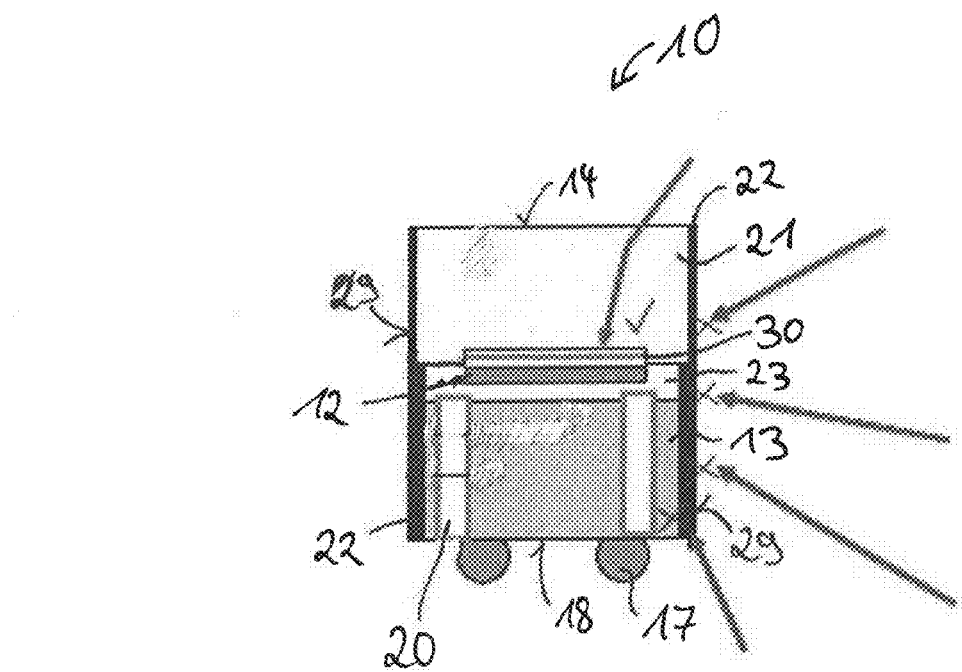

In FIG. 10, a cut-away view of a further exemplary embodiment of an optical sensor is shown.

Figure 11A:
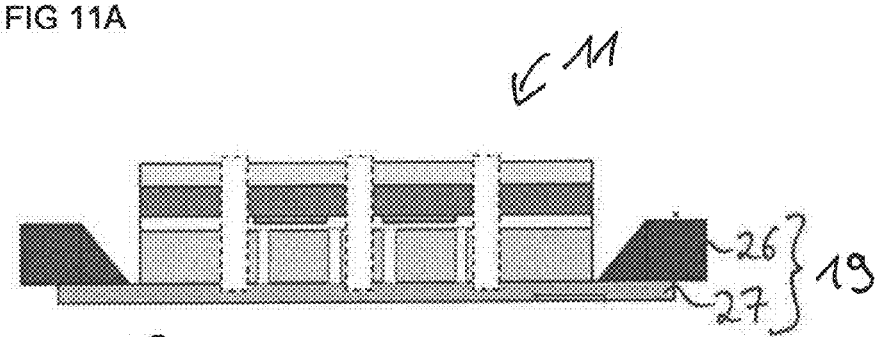
Figure 11B:
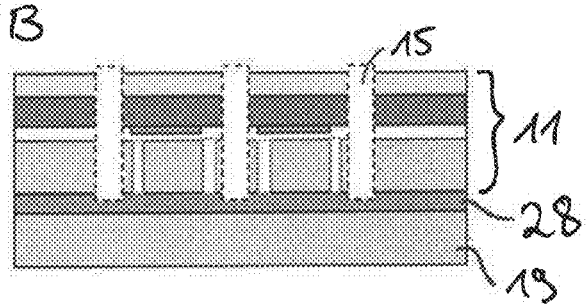

In FIGS. 11A and 11B cut-away views of exemplary handling substrates with an optical sensor arrangement are shown.

DETAILED DESCRIPTION

Figure 1A:
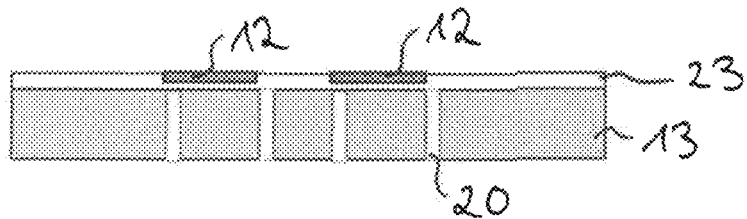

With FIGS. 1A to 1F, an exemplary embodiment of the method for manufacturing an optical sensor 10 is described. In FIG. 1A a cutaway view of a carrier 13 is shown. The carrier 13 is a wafer and it can comprise, for example, silicon with a high dopant concentration. The carrier 13 is opaque for electromagnetic radiation which his to be detected by the optical sensor 10. A semiconductor layer 23 is arranged on the carrier 13 and has the same lateral extent as the carrier 13. The semiconductor layer 23 can comprise several layers or structures and can be for example a complementary metal oxide semiconductor (CMOS) structure. Within the semiconductor layer 23 two optical sensor elements 12 are arranged. The optical sensor elements 12 can be, for example, charge coupled devices, complementary metal oxide semiconductor devices, photo diodes, ultra-violet sensors or pyro-electrical sensors. Four electrically conductive vias 20 extend through the carrier 13 in vertical direction z which is perpendicular to the main plane of extension of the carrier 13. Via the semiconductor layer 23 the four electrically conductive vias 20 are electrically connected with the two optical sensor elements 12. Each optical sensor element 12 is electrically connected with two electrically conductive vias 20.

Figure 1B:
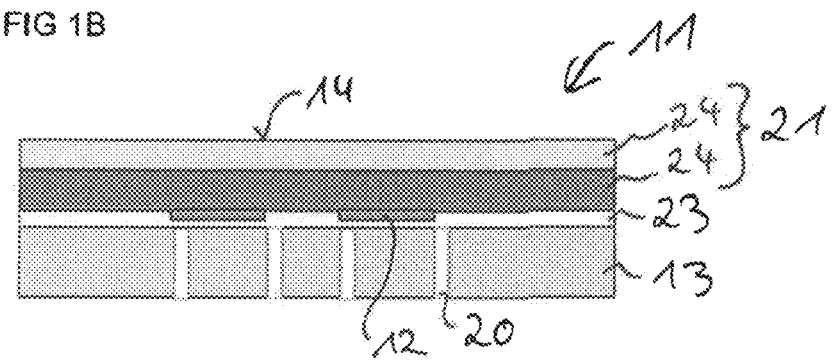

In FIG. 1B it is shown that in a next step of the method a cover element 21 comprising two mold layers 24 is formed on the optical sensor elements 12 and the semiconductor layer 23. The cover element 21 extends over the whole lateral extent of the carrier 13. The cover element 21 can comprise several mold layers 24 or structured or unstructured layers in order to improve the optical sensing of the optical sensor elements 12. The layers of the cover element 21 can for example comprise optical elements, create apertures, define opening angles or create defined distances. The cover element 21 can for example comprise transparent material as spacers, a diffuser or diffuser layers. The cover element 21 is formed by a molding process as for example wafer level molding and it can comprise silicon or an epoxy material.

The carrier 13, the optical sensor elements 12, the semiconductor layer 23 and the cover element 21 form an optical sensor arrangement 11. It is also possible that the optical sensor arrangement 11 comprises a plurality of optical sensor elements 12.

At the side of the cover element 21 which faces away from the optical sensor elements 12 a light entrance surface 14 is formed. The optical sensor elements 12 can detect electromagnetic radiation which enters the optical sensor arrangement 11 through the light entrance surface 14.

Figure 1C:
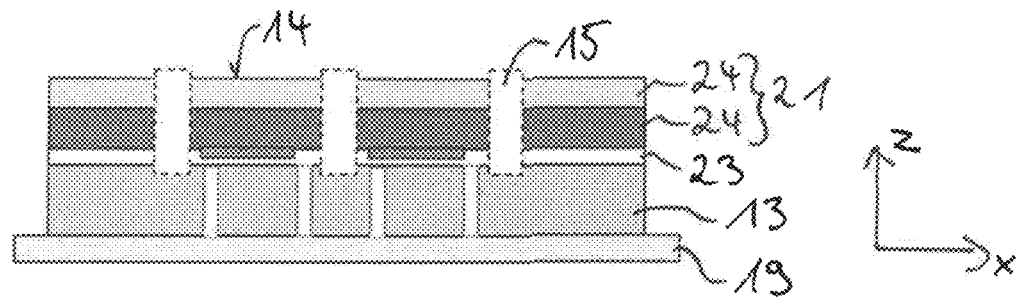

In a next step of the method, as shown in FIG. 1C, the carrier 13 is fixed to a handling substrate 19. The handling substrate 19 facilitates the handling of the carrier 13 during processing. The handling substrate 19 can for example be connected with the carrier 13 via a glue layer 28 which is not shown. Furthermore, three trenches 15 are formed in vertical direction z. The trenches 15 are arranged next to the optical sensor elements 12 such that on each side of each optical sensor element 12 a trench 15 is arranged. The trenches 15 are arranged next to the optical sensor elements 12 in lateral direction x which is parallel to the main plane of extension of the carrier 13. The trenches 15 extent from the light entrance surface 14 to the carrier 13. The trenches 15 extent only through a part of the carrier 13. This means, the extension of the trenches 15 in vertical direction z is smaller than the total extension of the optical sensor arrangement 11 in vertical direction z. The trenches 15 are formed by dicing all layers and materials of the optical sensor arrangement 11 from the light entrance surface 14 towards the carrier 13. The dicing process can be for example a mechanical dicing step, plasma dicing or laser dicing. It is also possible that the trenches 15 are formed by a sawing process.

Figure 1D:
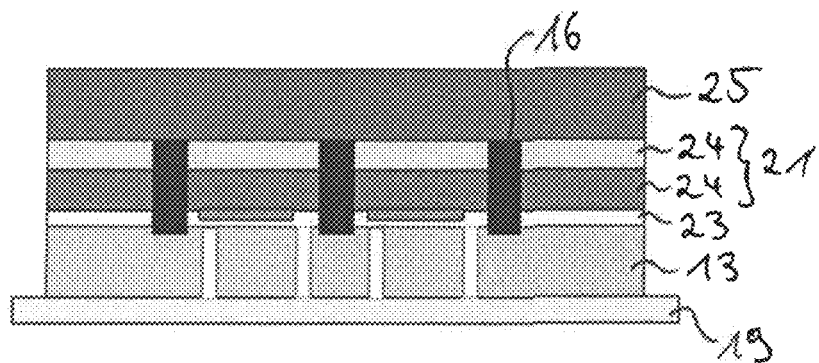

In FIG. 1D it is shown that in a next step of the method the trenches 15 are coated with an opaque material 16. The trenches 15 are filled with the opaque material 16 via a molding process. Therefore, a mold tool 25 is arranged at the light entrance surface 14. The trenches 15 are completely filled with the opaque material 16. The molding process can be for example transfer molding or wafer-level molding.

Figure 1E:
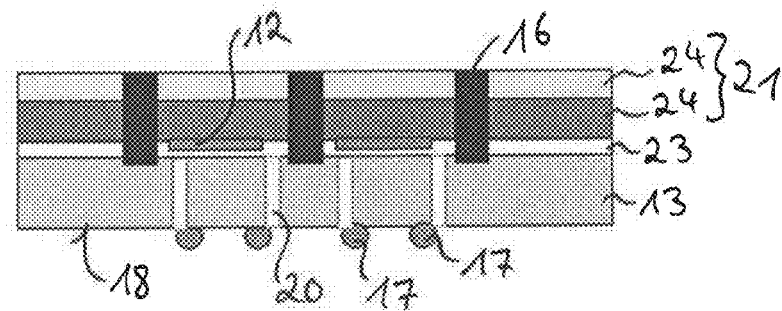

In a next step of the method, as shown in FIG. 1E, the mold tool 25 is removed again. Furthermore, electrical contacts 17 are formed at a back side 18 of the carrier 13 facing away from the optical sensor elements 12. The electrical contacts 17 comprise solder bumps. At the electrical contacts 17 the optical sensor elements 12 can be electrically contacted. Therefore, the optical sensor arrangement 11 is surface-mountable.

Figure 1F:
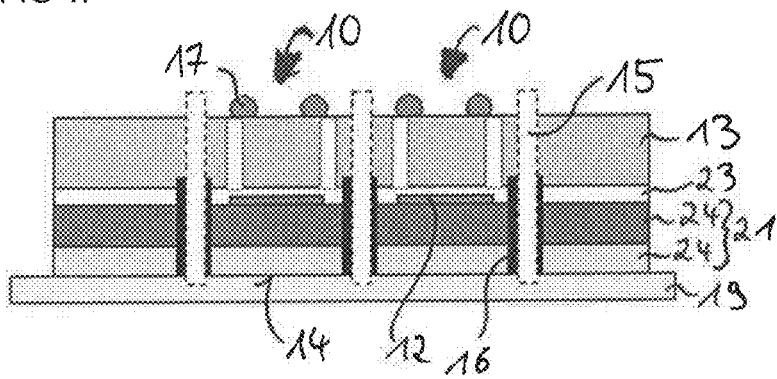

In a next step of the method, as shown in FIG. 1F, the handling substrate 19 is arranged at the light entrance surface 14. It is also possible that a handling substrate 19 which is different from the handling substrate 19 shown in FIG. 1C is employed. Furthermore, the optical sensor arrangement 11 is diced along the trenches 15 and through the carrier 13 along a vertical line which extends through the trenches 15. In this way, two optical sensors 10 are formed by singulating the optical sensor arrangement 11. The light entrance surface 14 of each optical sensor 10 is free of electrical contacts 17 and free of the opaque material 16 above the optical sensor elements 12.

Since the optical sensor elements 12 are provided on the carrier 13, which can be a wafer, a plurality of optical sensors 10 can be manufactured at the same time. Preferably, a plurality of optical sensor elements 12 is provided on the carrier 13. Since several thousands of optical sensors 10 can be processed simultaneously on wafer-level, the optical sensors 10 can be manufactured very efficiently and at reduced cost. Furthermore, it is more efficient to combine the coating of the optical sensors 10 and the singulation of the optical sensor arrangement 11 by forming the trenches 15 between the optical sensor elements 12.

The optical sensor 10 is manufactured on wafer-level which reduces the cost compared to solutions where single die handling is needed.

Figure 2:
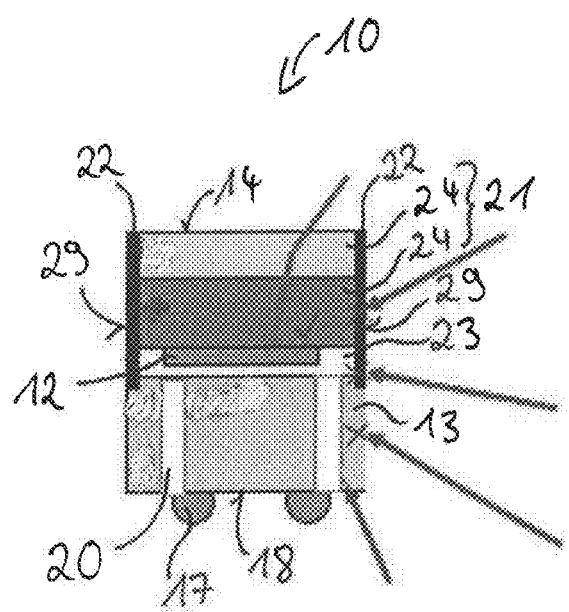
In FIG. 2, a cut-away view of an exemplary embodiment of an optical sensor is shown.

In FIG. 2 a cutaway view of an embodiment of an optical sensor 10 is shown which is manufactured by the method described with FIGS. 1A to 1F. The optical sensor 10 comprises a carrier 13. On the carrier 13 a semiconductor layer 23 is arranged within which an optical sensor element 12 is arranged. A cover element 21 comprising two mold layers 24 is arranged on the optical sensor element 12 and the semiconductor layer 23. A light entrance surface 14 is arranged at the side of the cover element 21 which faces away from the optical sensor element 12. Two electrically conductive vias 20 extend through the carrier 13 from the semiconductor layer 23 towards a back side 18 of the carrier 13 that faces away from the optical sensor element 12. At the back side 18 two electrical contacts 17 are arranged. The electrical contacts 17 each comprise a sold a bump. The optical sensor element 12 is electrically connected with the electrical contacts 17 via the electrically conductive vias 20.

The optical sensor 10 further comprises side surfaces 29 that are perpendicular to the main plane of extension of the carrier 13. This means the side surfaces 29 comprise all outer surfaces of the optical sensor 10 except for the back side 18 and the light entrance surface 14. The optical sensor 10 further comprises an opaque material 16 that forms a coating 22 at the side surfaces 29. The side surfaces 29 are not completely covered with the coating 22. The side surfaces 29 are covered with the coating 22 only in the region where the trench 15 was formed. This means, the coating 22 extends from the light entrance surface 14 to the carrier 13. A part of the side surfaces of the carrier 13 is free of the coating 22. The side surfaces 29 and the coating 22 show signs of the dicing process, which means that the side surfaces 29 and the coating 22 can be rough or structured because of the dicing process. The coating 22 and the side surfaces of the carrier 13 that are not covered with the coating 22 can show different signs of the dicing process which means they can be differently structured.

As the coating 22 reaches up to the light entrance surface 14, the light entrance surface 14 is only free of the opaque material 16 above the optical sensor element 12 in vertical direction z. In the region of the coating 22, the light entrance surface 14 is not free of the opaque material 16. The coating 22 laterally surrounds the light entrance surface 14 in the main plane of extension of the light entrance surface 14.

Since the carrier 13 comprises an opaque material 16 and the coating 22 is arranged at the side surfaces 29 of the optical sensor 10 electromagnetic radiation can only enter the optical sensor 10 through the light entrance surface 14. This means, all or most of the electromagnetic radiation hitting the optical sensor 10 at the side surfaces 29 or the back side 18 is absorbed and does not reach the optical sensor element 12. The electromagnetic radiation reaching the optical sensor element 12 is represented by the solid arrow and the electromagnetic radiation which is absorbed by the coating 22 or the carrier 13 is represented by dashed arrows. Therefore, the coating 22 and the opaque carrier 13 prevent unwanted light from reaching the optical sensor element 12.

The opaque coating 22 at the side surfaces 29 of the optical sensor 10 can be very thin. Advantageously, with a very thin coating 22 the total footprint of the optical sensor 10 is not significantly increased by adding the coating 22.

Figure 3A:
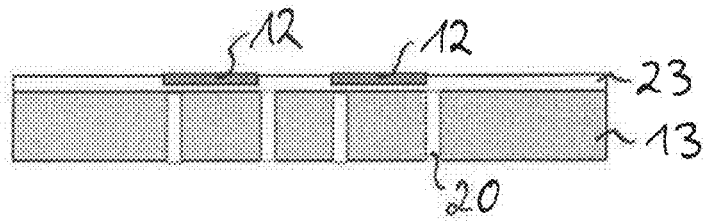
Figure 3B:
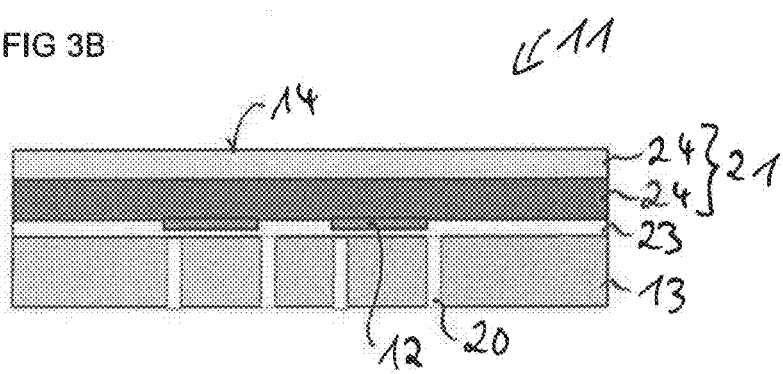

With FIGS. 3A to 3F, a further exemplary embodiment of the method for manufacturing an optical sensor 10 is described. In FIGS. 3A and 3B the same steps as in FIGS. 1A and 1B are shown.

Figure 3C:
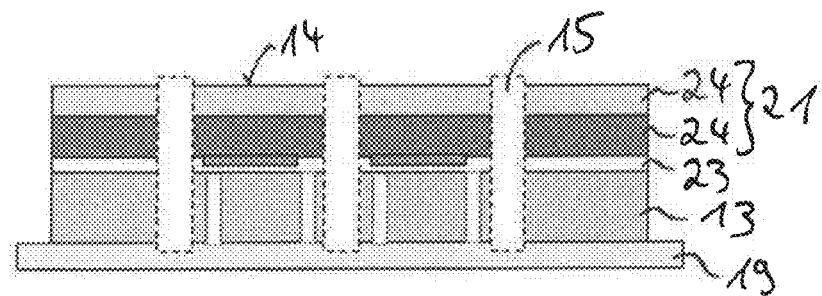

In FIG. 3C it is shown that a handling wafer 29 is arranged at the back side 18 of the carrier 13. The three trenches 15 which are formed by dicing extend from the light entrance surface 14 through the whole carrier 13 towards the handling substrate 19. The diced parts of the optical sensor arrangement 11 are held together by the handling substrate 19.

Figure 3D:
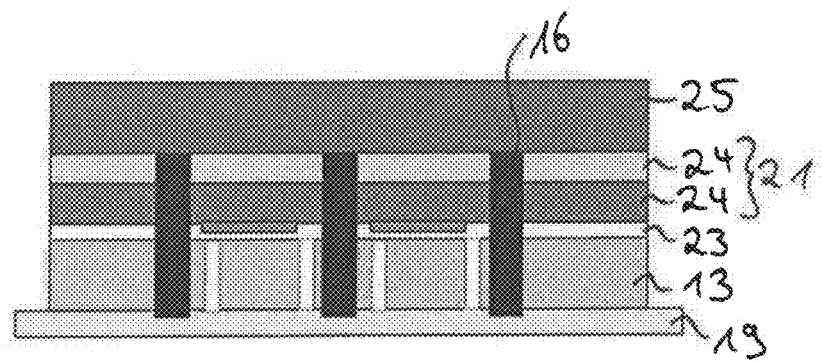

In FIG. 3D it is shown that in a next step of the method the trenches 15 are coated with an opaque material 16 via a molding process. Therefore, a mold tool 25 is arranged at the light entrance surface 14. The trenches 15 are completely filled with the opaque material 16.

Figure 3E:
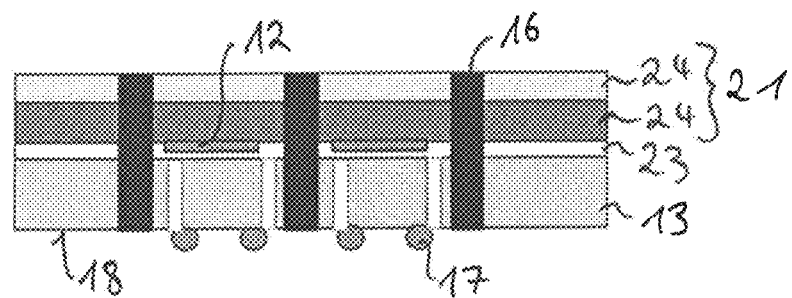

In a next step of the method, as shown in FIG. 3E, electrical contacts 17 are formed at the back side 18.

Figure 3F:
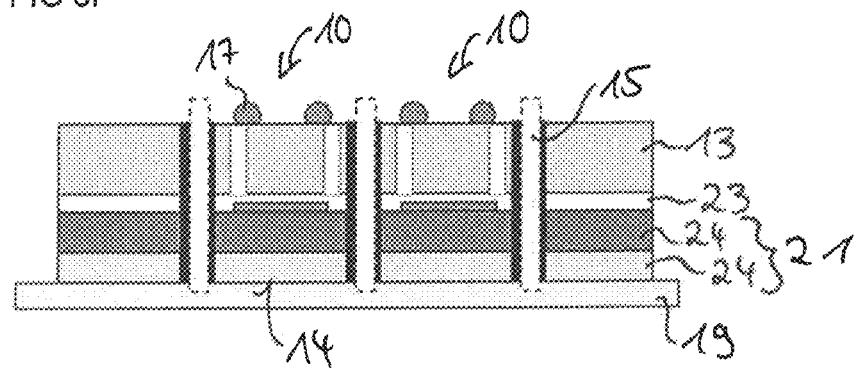

In FIG. 3F it is shown that optical sensors 10 are formed by dicing the optical sensor arrangement 11 along the trenches 15. The trenches 15 are diced in such a way that the inner walls of the trenches 15 are completely coated with the opaque material 16 after the dicing. In this way, an opaque coating 22 at the side surfaces 29 of the optical sensor 10 is formed where the coating 22 extends from the light entrance surface 14 to the back side 18. Since the side surface of the carrier 13 is completely coated with the coating 22 the material of the carrier 13 can be chosen irrespective of its absorption properties. In this case it is possible that the carrier 13 does not comprise an opaque material 16.

In FIG. 4 a cutaway view of an embodiment of an optical sensor 10 that is manufactured by the method shown with FIGS. 3A to 3F is shown. The only difference to the embodiment shown in FIG. 2 is that the coating 22 at the side surfaces 29 of the optical sensor 10 extends from the light entrance surface 14 to the back side 18. This means, side surfaces 29 are completely coated with the opaque coating 22. Therefore, the carrier 13 does not necessarily comprise an opaque material 16.

Figure 5A:
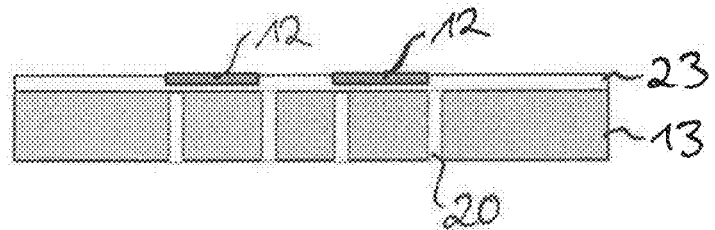

With FIGS. 5A to 5H, a further exemplary embodiment of the method for manufacturing an optical sensor 10 is described. In FIG. 5A the same setup as in FIG. 1A is shown.

Figure 5B:
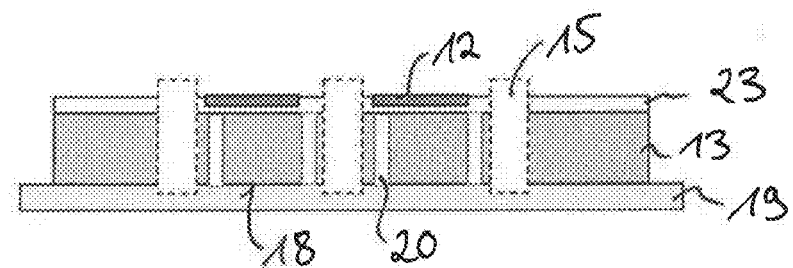

In FIG. 5B it is shown that a handling substrate 19 is arranged at the back side 18 of the carrier 13. Three trenches 15 are formed next to the optical sensor elements 12. The trenches 15 extend from the semiconductor layer 23 to the back side 18 of the carrier 13. The trenches 15 are formed by a dicing process. The diced parts of the carrier 13 are stabilized by the handling substrate 19.

Figure 5C:
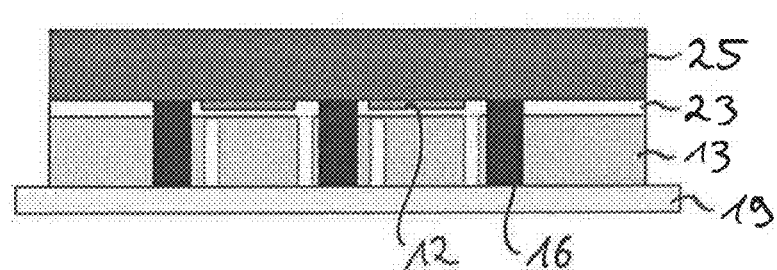

In a next step of the method, as shown in FIG. 5C, the trenches 15 are coated with an opaque material 16. A mold tool 25 is arranged at the side of the semiconductor layer 23 that faces away from the carrier 13 and the trenches 15 are completely filled with the opaque material 16 via a molding process. The lateral extent of the carrier 13 with the trenches 15 which are filled with the opaque material 16 is the same as the lateral extent of the carrier 13 before the formation of the trenches 15. Therefore, the same processing equipment can be used for this method as for methods where the carrier 13 is not completely diced for the formation of the trenches 15.

Figure 5D:
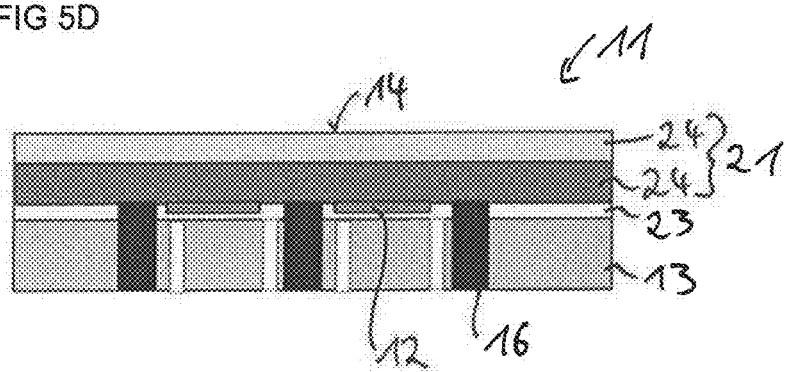

In a next step of the method, as shown in FIG. 5D, the handling substrate 19 and the mold tool 25 are removed. Furthermore, a cover element 21 comprising two mold layers 24 is arranged at the side of the semiconductor layer 23 that faces away from the carrier 13.

Figure 5E:
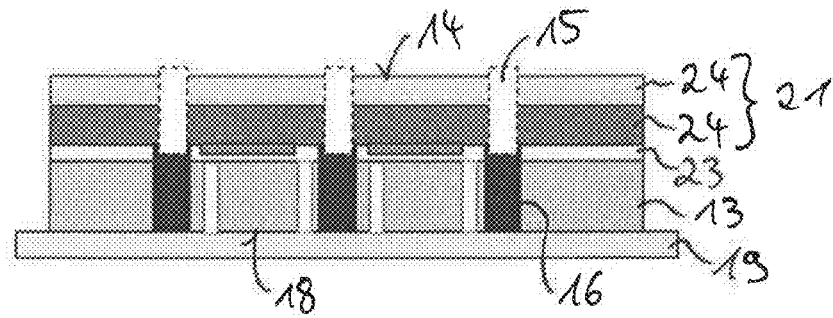

In FIG. 5E it is shown that three trenches 15 are formed in the cover element 21 above the three trenches 15 that extend through the carrier 13. The lateral extent of the trenches 15 formed in the cover element 21 is slightly smaller than the lateral extent of trenches 15 that extend through the carrier 13. It is also possible that the trenches 15 in the cover element 21 and the trenches 15 that extend through the carrier 13 have the same lateral extent. The trenches 15 that are formed in the cover element 21 extend from the light entrance surface 14 of the optical sensor arrangement 11 to the carrier 13. The optical sensor arrangement 11 is stabilized by the handling substrate 19 which is arranged at the back side 18.

Figure 5F:
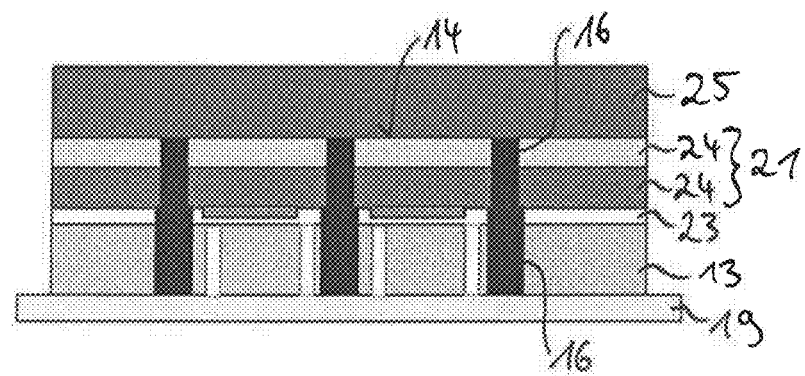

In a next step of the method, as shown in FIG. 5F, the trenches 15 that are formed in the cover element 21 are coated with an opaque material 16. A mold tool 25 is arranged at the light entrance surface 14 and the trenches 15 are completely filled with the opaque material 16 by a molding process.

Figure 5G:
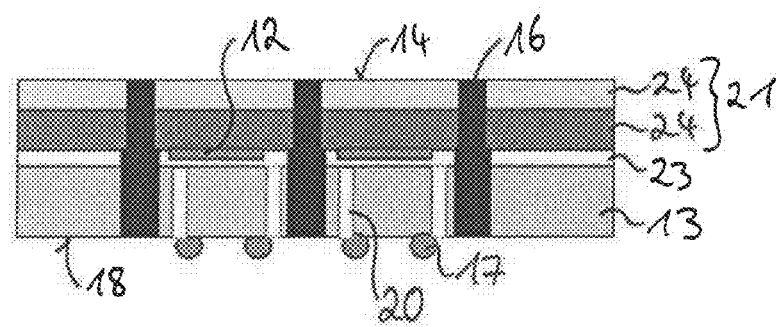

In FIG. 5G it is shown that the mold tool 25 and the handling substrate 19 are removed from the optical sensor arrangement 11. Electrical contacts 17 are formed at the back side 18. The electrical contacts 17 are electrically connected with the optical sensor elements 12 via the electrically conductive vias 20.

Figure 5H:
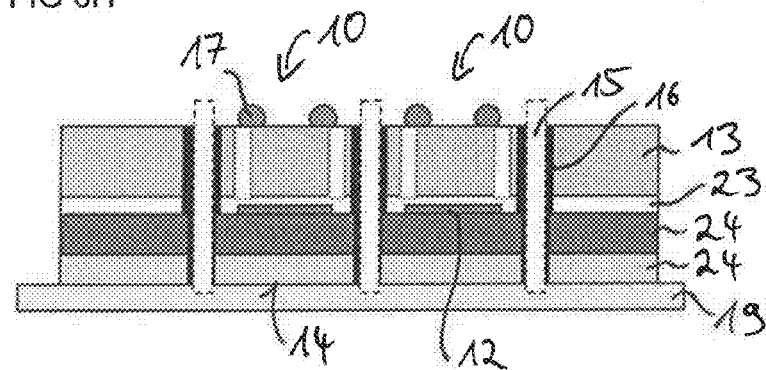

In a next step of the method, as shown in FIG. 5H, two optical sensors 10 are formed by dicing the optical sensor arrangement 11 along the trenches 15 that extend from the light entrance surface 14 to the back side 18. During the dicing process a handling substrate 19 is arranged at light entrance surface 14. The optical sensors 10 are singulated in such a way that the side surfaces 29 of the optical sensors 10 are completely covered with the opaque material 16.

In FIG. 6 a cutaway view of an embodiment of an optical sensor 10 that is manufactured by the method shown with FIGS. 5A to 5H is shown. The side surfaces 29 are completely covered with the coating 22. The thickness of the coating 22 is larger in the regions of the semiconductor layer 23 and the carrier 13 than in the region of the cover element 21. The difference in the thickness of the coating 22 is caused by the different thicknesses of the trenches 15 in the cover element 21 and the carrier 13. Preferably, the thicknesses of the coating 22 in the region of the cover element 21 and of the carrier 13 are approximately the same.

With FIG. 7 a manufacturing step for manufacturing an optical sensor 10 is described. In this embodiment of the method the electrical contacts 17 which comprise solder bumps are formed before the trenches 15 are filled with the opaque material 16. A handling substrate 19 is arranged at the back side 18 and at the electrical contacts 17. The trenches 15 and the back side 18 are covered with the opaque material 16 by a molding process. Therefore, a mold tool 25 is arranged at the light entrance surface 14. The solder bumps of the electrical contacts 17 are partially covered with the opaque material 16. In this way, the back side 18 is completely covered with the opaque material 16. During the manufacturing, the processing is adapted to the solder bumps arranged at the back side 18. For example, a handling substrate 19 is required that can accommodate the solder bumps.

By coating the back side 18 with the opaque material 16 unwanted light is prevented from reaching the optical sensor elements 12 from the back side 18. Coating the back side 18 is advantageous if the carrier 13 is not opaque for the electromagnetic radiation to be detected by the optical sensors 12.

In FIG. 8 a cutaway view of an embodiment of an optical sensor 10 that is manufactured by the method shown with FIG. 7 is shown. The side surfaces 29 and the back side 18 are covered with the opaque material 16. This means, the coating 22 completely covers the side surfaces 29 and the back side 18.

Figure 9A:
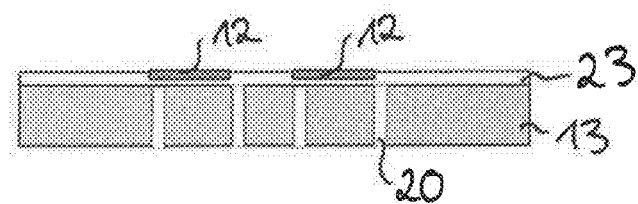
Figure 9B:
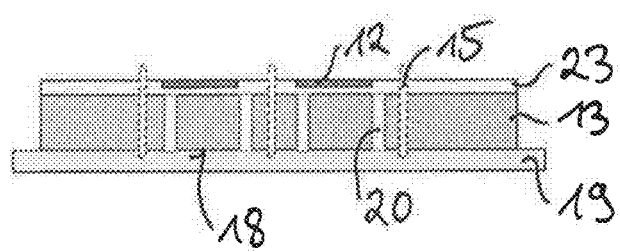

With FIGS. 9A to 9I, a further exemplary embodiment of the method for manufacturing an optical sensor 10 is described. In FIGS. 9A and 9B the same steps as in FIGS. 5A and 5B are shown.

Figure 9C:
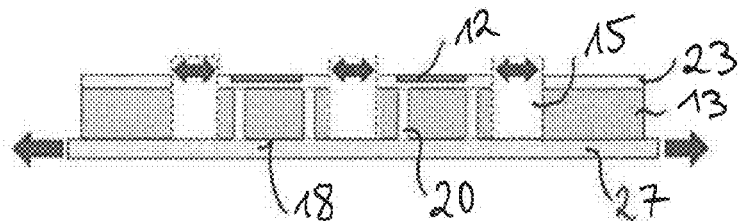

In FIG. 9C it is shown that the handling substrate 19 is expanded in lateral direction x after the formation of the trenches 15. Expanding the handling substrate 19 means that the lateral extent of the handling substrate 19 is increased during expanding. Therefore, the handling substrate 19 can comprise a tape 27 which is fixed to a handling frame 26. The optical sensor arrangement 11 is arranged on the tape 27. The tape 27 can be for example a polymer foil which can be expanded or stretched in the lateral direction x. When the handling substrate 19 is expanded the lateral extent of the trenches 15 is increased.

Figure 9D:
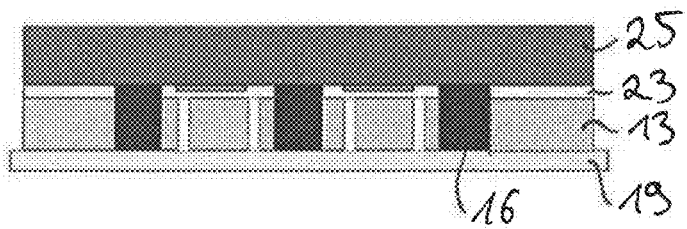

In a next step of the method, as shown in FIG. 9D, the trenches 15 are filled with the opaque material 16 via a molding process.

Figure 9E:
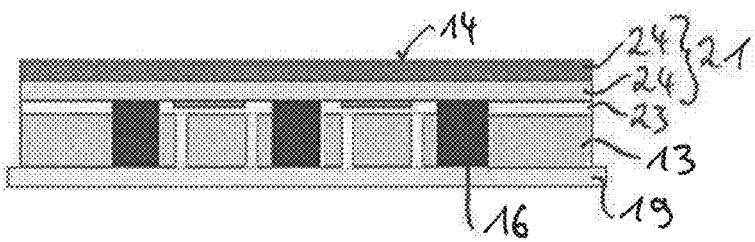

In FIG. 9E it is shown that a cover element 21 is arranged at the side of the semiconductor layer 23 that faces away from the carrier 13.

Figure 9F:
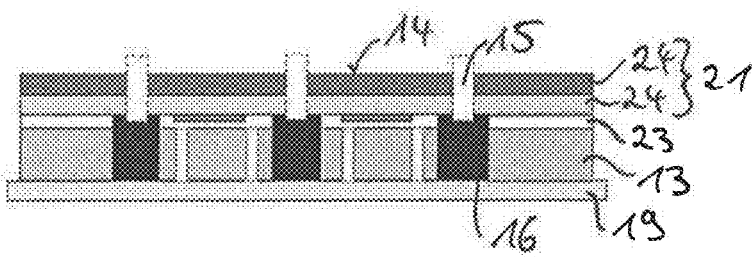

In a next step of the method, as shown in FIG. 9F, three trenches 15 are formed in the cover element 21 above the three trenches 15 that extend through the carrier 13. The lateral extent of the trenches 15 formed in the cover element 21 is slightly smaller than the lateral extent of the trenches 15 that extend through the carrier 13.

Figure 9G:
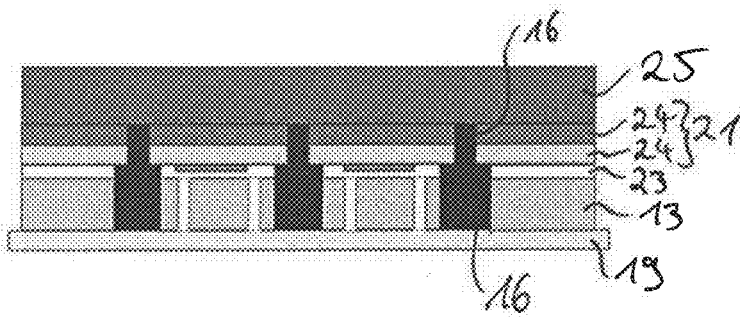

In FIG. 9G it is shown that the trenches 15 that extend through the cover element 21 are filled with the opaque material 16 by a molding process.

Figure 9H:
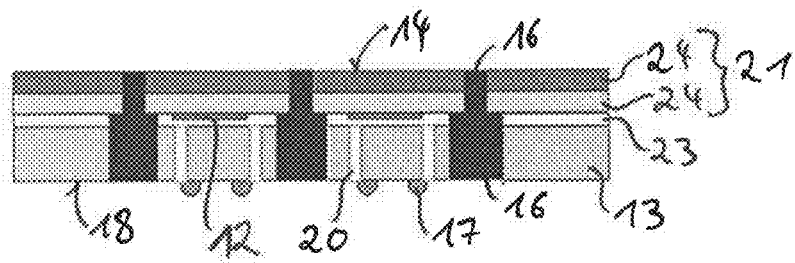

In FIG. 9H it is shown that the mold tool 25 and the handling substrate 19 are removed from the optical sensor arrangement 11. Electrical contacts 17 comprising solder bumps are formed at the back side 18.

Figure 9I:
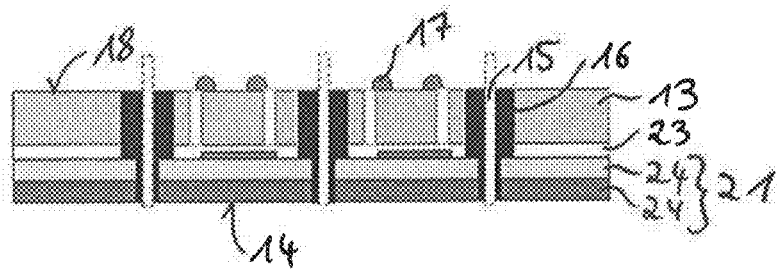

In a next step of the method, as shown in FIG. 9I, optical sensors 10 are formed by dicing the optical sensor arrangement 11 through the trenches 15. The optical sensor arrangement 11 is diced from the back side 18 to the light entrance surface 14.

In FIG. 10 a cutaway view of an embodiment of an optical sensor 10 that is manufactured by the method shown with FIGS. 9A to 9I is shown. The side surfaces 29 are completely covered with the coating 22. Furthermore, a filter layer 30 is directly arranged on the optical sensor element 12. This means, the optical elements or structures of the cover element 21 can also be directly arranged on top of the optical sensor element 12.

By increasing the thickness of the trenches 15 during the manufacturing also the thickness of the opaque material 16 to be filled in the trenches 15 is increased. In this way, the thickness of the opaque coating 22 can be tuned or set. By tuning the thickness of the trenches 15 and the opaque material 16 within the trenches 15, also the thickness of the opaque coating 22 which remains at the side surfaces 29 of the optical sensor 10 can be tuned. A tuning of the thickness of the opaque coating 22 can be desired for tuning the absorption coefficient of the opaque coating 22. For example, by increasing the thickness of the opaque coating 22 the absorption coefficient can be increased.

Advantageously, by expanding the handling substrate 19 for increasing the thickness of the trenches 15, the same amount of material of the carrier 13 and the semiconductor layer 23 are required as without expanding the handling substrate 19.

In FIG. 11A a cut-away view of an exemplary handling substrate 19 with an optical sensor arrangement 11 is shown. The handling substrate 19 comprises a tape 27 on which the optical sensor arrangement 11 is arranged and a handling frame 26. The handling frame 26 is arranged around the optical sensor arrangement 11 and it holds and stabilizes the tape 27.

In FIG. 11B a cutaway view of a further exemplary handling substrate 19 with an optical sensor arrangement 11 is shown. The optical sensor arrangement 11 is fixed to the handling substrate 19 via a glue layer 28 which can be removed. As the glue layer 28 is removed again during processing it is possible, as shown in FIG. 11B, that the trenches 15 extend through a part of the glue layer 28.

The invention claimed is:

1. A method for manufacturing an optical sensor, the method comprising:
providing an optical sensor arrangement which comprises at least two optical sensor elements on a carrier, where the optical sensor arrangement comprises a light entrance surface at a side of the at least two optical sensor elements facing away from the carrier,
forming a trench between two of the at least two optical sensor elements in a vertical direction which is perpendicular to a main plane of extension of the carrier, where the trench extends from the light entrance surface of the sensor arrangement at least to the carrier,
coating the trench with an opaque material,
forming electrical contacts for the at least two optical sensor elements on a back side of the carrier facing away from the at least two optical sensor elements,
forming at least one optical sensor by dicing the optical sensor arrangement along the trench, where
each optical sensor comprises an optical sensor element,
the light entrance surface is free of electrical contacts and at least partially free of the opaque material above the optical sensor elements,
a handling substrate is arranged at the back side of the carrier during forming the trench and during coating the trench with the opaque material,
the handling substrate is a tape that is expanded in a lateral direction during the manufacturing, where the lateral direction is parallel to the main plane of extension of the carrier, and
the tape is expanded in the lateral direction after forming the trench and before applying the opaque material.

2. The method for manufacturing an optical sensor according to claim 1, wherein side surfaces of the trench are coated with the opaque material.

3. The method for manufacturing an optical sensor according to claim 1, wherein the trench is coated by a molding process.

4. The method for manufacturing an optical sensor according to claim 1, wherein the trench is completely filled with the opaque material.

5. The method for manufacturing an optical sensor according to claim 1, wherein the optical sensor is formed by dicing after the trench is coated with the opaque material.

6. The method for manufacturing an optical sensor according to claim 1, wherein at least one electrically conductive via is formed in the carrier.

7. The method for manufacturing an optical sensor according to claim 1, wherein after forming the optical sensor by dicing a thickness of the opaque material in a lateral direction amounts to less than 20% of a thickness of one optical sensor in the lateral direction which is parallel to the main plane of extension of the carrier.

8. The method for manufacturing an optical sensor according to claim 1, wherein the carrier comprises an opaque material.

9. The method for manufacturing an optical sensor according to claim 1, wherein at least one cover element is arranged at the side of the at least two optical sensor elements which faces away from the carrier.

10. The method for manufacturing an optical sensor according to claim 1, wherein the trench extends through the whole carrier in the vertical direction.

* * * * *